(12) United States Patent
Singh et al.

(10) Patent No.: US 7,477,070 B2
(45) Date of Patent: Jan. 13, 2009

(54) RAPID INTERCONNECT AND LOGIC TESTING OF FPGA DEVICE

(75) Inventors: Pramod Kumar Singh, Uttar Pradesh (IN); Ashish Kumar Goel, Uttar Pradesh (IN)

(73) Assignee: Sicronic Remote KG, LLC, Wilmington, DE (US)

( * ) Notice: Subject to any disclaimer, the term of this patent is extended or adjusted under 35 U.S.C. 154(b) by 261 days.

(21) Appl. No.: 11/294,645

(22) Filed: Dec. 5, 2005

(65) Prior Publication Data

US 2006/0255833 A1  Nov. 16, 2006

(30) Foreign Application Priority Data

Dec. 6, 2004  (IN)  ............... 2439/DEL/2004

(51) Int. Cl.
*H03K 19/173* (2006.01)

(52) U.S. Cl. .............................. 326/38; 326/41

(58) Field of Classification Search .............. 326/37–41
See application file for complete search history.

(56) References Cited

U.S. PATENT DOCUMENTS 5,781,756 A * 7/1998 Hung .................... 711/103
5,844,422 A * 12/1998 Trimberger et al. ......... 326/38
5,910,732 A * 6/1999 Trimberger ............... 326/38

OTHER PUBLICATIONS

Renovell, M., et al., "Testing the Interconnect of RAM-Based FPGAs," IEEE Design and Test of Computers, pp. 45-50, Jan.-Mar. 1998.

* cited by examiner

*Primary Examiner*—Don P Le

(57) ABSTRACT

A FPGA device that includes a plurality of programmable logic blocks connected to each other through interconnect resources, one or more sets of registers connected to the interconnect resources for configuring the programmable logic blocks. Additional logic is provided with the registers for selecting an interconnect/logic block testing mode thereby enabling a rapid interconnect/logic testing.

22 Claims, 4 Drawing Sheets

| S | Switching Block |
| C | Connecting Block |
| PLB | Programmable Logic Block |

| S | Switching Block |
| --- | --- |
| C | Connecting Block |
| PLB | Programmable Logic Block |

RAPID INTERCONNECT AND LOGIC TESTING OF FPGA DEVICE

BACKGROUND

Field programmable gate arrays (FPGAs) are regular structures of logic modules communicating via an interconnect architecture of lines and switches. A user programs the logic modules and interconnect structures to perform particular functions and realize the FPGA's global function. Because of their programmability in the field, they have been widely used for rapid prototyping or reconfiguration of complex digital systems. There are many types of FPGA, such as RAM-based, EPROM switches or antifuses. Out of these, RAM-based FPGAs are the most popular and widely used.

A test procedure for a FPGA consists of successively configuring the FPGA using configuration bits and thereafter applying a test sequence using the operation inputs. The FPGA configuration corresponds to a very long sequence of bits, serially entered in the FPGA. Accordingly, the FPGA configuration process is excessively time consuming and incurs substantial reprogramming cost.

Further, the testing of an M*M matrix of programmable logic blocks (PLB) and interconnects of a RAM-based FPGA involves controlling and observing the whole matrix (Referring Paper: "Testing the interconnect of RAM-Based FPGAs" by Michel Renovell, Jean Michel Portal, Joan Figurras and Rervant Zorian in Research Journal IEEE Design and Test of Computers, March 1998). Individual access to each PLB and the interconnect lines is not possible and the FPGA does not have enough I/O pads to control and observe each PLB and interconnect line in parallel from outside. Testing for shorts and opens of interconnect lines requires two I/O pads per line, one on each line extremity. This means that, for 80 interconnect lines of a column or row, an FPGA would require 160 pads which is practically not feasible. The FPGAs usually contain four pads per column and four pads per row, i.e., for an M*M array an FPGA has 8M pads.

To reduce the required number of I/O pads one possible solution can be to perform a sort of line globalization by connecting some of the lines. For n lines, it requires 2 n pads to form only one line. Thus all vertical lines to form one snake and all horizontal lines to form another snake and the whole interconnect structure resembles a snake requiring only 4 k pads. This solution consumes a large time.

A method for interconnect and logic block testing of RAM-based FPGAs is also described in "Research Journal IEEE Design and Test Of Computers," January-March 1998 by Renovell, Portal et. al. In this approach there are two types of inputs: operation and configuration. One operation uses inputs during normal circuit operation to apply input vectors and another usually uses configuration inputs before normal circuit operation to configure the FPGA. This approach is dependent on number/mode of configuration and still applies the test vectors from the external IO pad. Thus the earlier discussed limitations relating to IO ports still exist.

SUMMARY

One embodiment provides a method and an FPGA device for interconnect and logic block testing. This embodiment reduces the number of IOs for testing FPGA interconnects.

One embodiment tests the interconnects using vertical and horizontal shift registers.

One embodiment provides an FPGA device that includes a plurality of programmable logic blocks connected to each other through interconnect resources, one or more sets of registers connected to said interconnect resources for configuring said programmable logic blocks, and additional logic for selecting an interconnect testing mode thereby enabling a rapid interconnect testing.

The registers are placed in the center of the device, perpendicular to each other to form four quadrants of said programmable logic block for enabling diagonal interconnect testing.

The additional logic is a demultiplexer connected to each output line of said registers, said demultiplexer receives a control signal at its select terminal for selecting one of the configuration or testing mode.

One embodiment also provides a method for interconnect and logic block testing of a field programmable gate array (FPGA), comprising the steps of:

providing a plurality of programmable logic blocks connected to each other through interconnect resources, connecting one or more sets of registers to said interconnect resources for configuring said programmable logic blocks, providing additional logic with said registers for selecting an interconnect testing mode for enabling a rapid interconnect testing and reducing the required IO pins.

The above method includes steps of demultiplexing the output of each of said registers and selecting one of the configuration or testing modes.

The above method includes steps of placing said registers in the center of the programmable logic array perpendicular to each other to form four quadrants of said programmable logic block for enabling diagonal interconnect testing.

BRIEF DESCRIPTION OF THE SEVERAL VIEWS OF THE DRAWINGS

The invention will now be described with reference to accompanying drawings.

DETAILED DESCRIPTION

Figure 1:
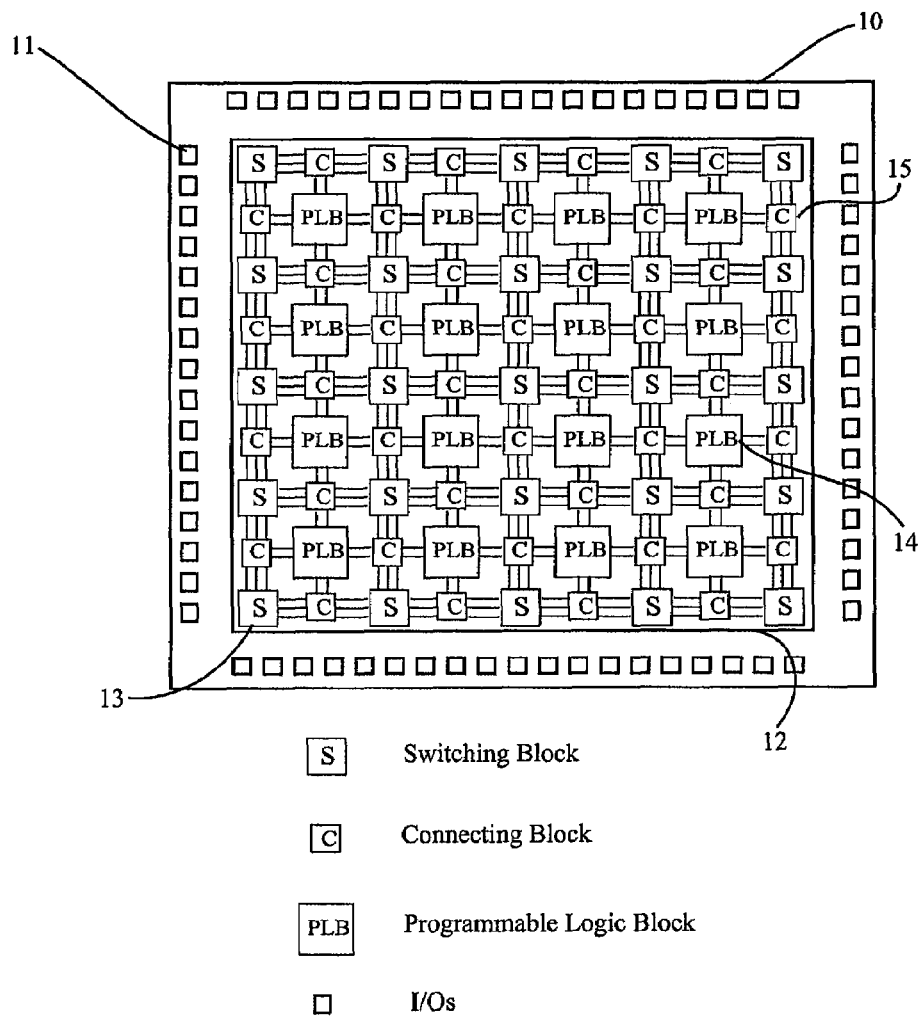
FIG. 1 shows a conventional FPGA that includes programmable logic blocks and interconnect resources.

FIG. 1 illustrates the block diagram of a conventional field programmable gate array (FPGA) 10, which includes an array 12 of programmable logic blocks (PLB) 14 and programmable interconnect resources, i.e., switching blocks 13 and connection blocks 15. The programmable interconnect resources 13 and 15 are located within the PLB array 12 and extend between the PLBs 14 and I/O Blocks (IOBs) 11. PLB array 12 provides functional elements for constructing logic circuits. The iOBs 11 provide an interface between the external pins of the FPGA 10 and the logic circuit implemented by the PLB array 12. The programmable interconnect resources (13 and 15) provide routing paths to connect the PLBs 14 and IOBs 11 onto the desired networks. Customized configuration of the FPGA 10 is achieved by programming internal static configuration memory cells that determine the logic functions and interconnections of the PLBs 14, IOBs 11 and interconnect resources 13 and 15.

Figure 2:
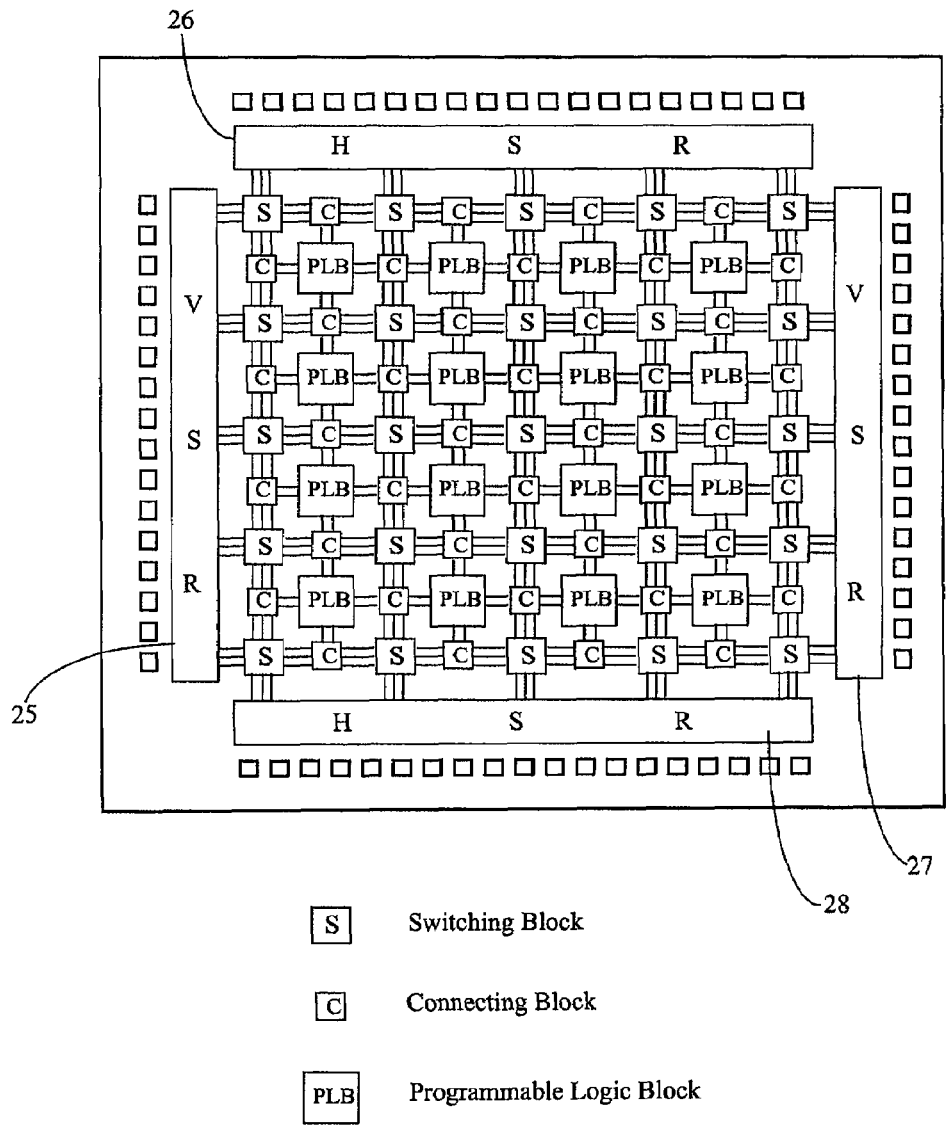
FIG. 2 shows a conventional FPGA that includes programmable logic blocks, interconnect resources, vertical and horizontal shift registers.

FIG. 2 shows a conventional FPGA having vertical shift registers 25 and 27 and horizontal shift registers 26 and 28. During configuration mode of the FPGA, the vertical shift registers 25 and 27 are used for loading the configuration data, which is then fed to configuration data lines (not shown in the figure) using horizontal shift registers 26 and 28. Connectivity of these registers with interconnect lines can be controlled through configuration or through global test enable. A test enable signal can be generated through some Joint Test Access Group (JTAG) instruction or external pad can also be used.

Not all FPGAs have registers 27 and 28. But these can be provided additionally, which will enable testing of configuration data lines and latch enable lines and can be used during the interconnect testing. It will overcome I/Os limitation in testing of interconnect lines.

During interconnect testing, the registers 25 and 26 can be used to feed the data in interconnect lines and the registers 27 and 28 can be used to capture the responses. The roles of these registers can be interchanged.

For testing of horizontal and vertical routing tracks, the FPGA is configured in such a manner that these tracks are enabled. After configuration, test data is provided by VSR 25 and HSR 26. Output of these tracks are captured on VSR 27 and HSR 28, which are then verified by scanning it out. Again the role of these registers can be interchanged.

Figure 3:
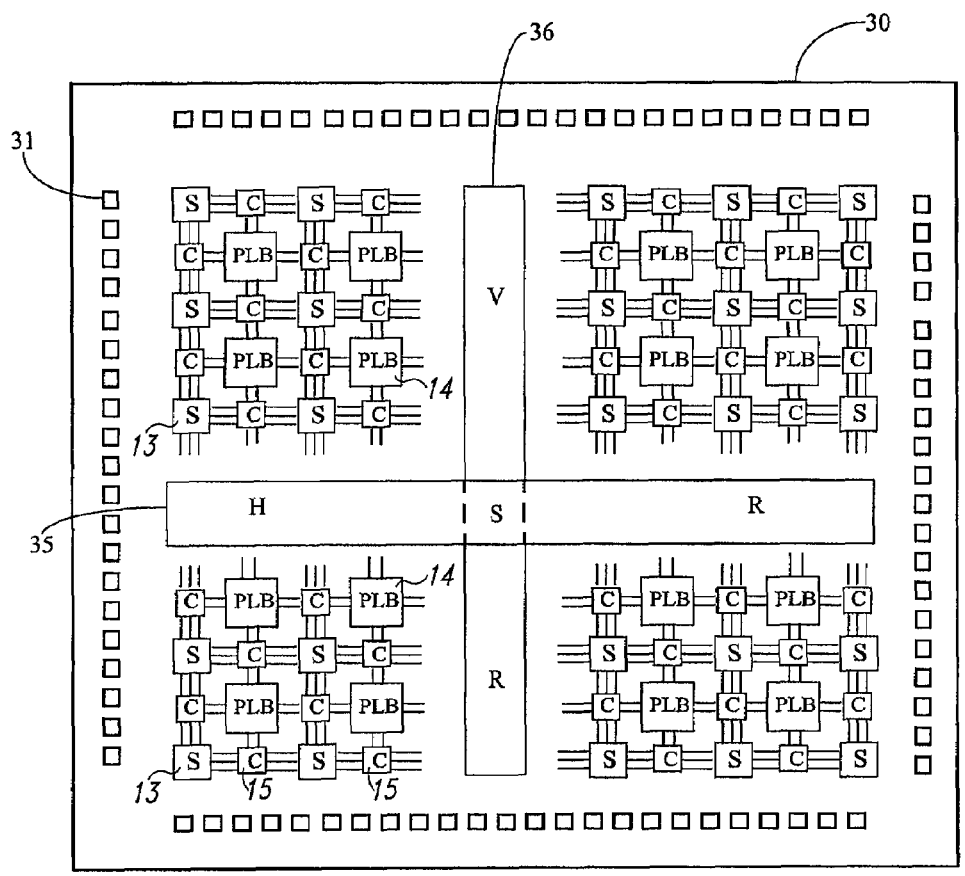
FIG. 3 shows an FPGA having vertical and horizontal shift registers placed perpendicular to each other in center, according to one embodiment of this invention.

FIG. 3 shows an FPGA 30 having vertical and horizontal shift registers (36, 35) placed in the center of the FPGA according to one embodiment. The FPGA 30 also includes switching blocks 13, PLBs 14, and connecting blocks 15 connected to one another to provide programmable logic. Each of the shift registers 35 and 36 includes a plurality of individual registers connected respectively to the switching blocks (S) 13. In this type of FPGA 30, the VSR 36 and HSR 35 are placed in the center to enable the diagonal interconnect track testing. The test vectors are applied to either VSR 36 or HSR 35 and the responses are captured correspondingly at HSR or VSR. Optionally, in the testing mode of this FPGA architecture IOBs 31 can also be used for providing test-vector and/or to observe the response.

For orthogonal interconnect track testing either test vectors are applied at said registers of the HSR 35 or VSR 36 and response is captured at IOBs 31 or the test vectors are applied at the IOs and response is captured at said registers. As both the IOBs and the registers are involved in the testing process the time and the resources required for completing the test operation is substantially low.

Figure 4:
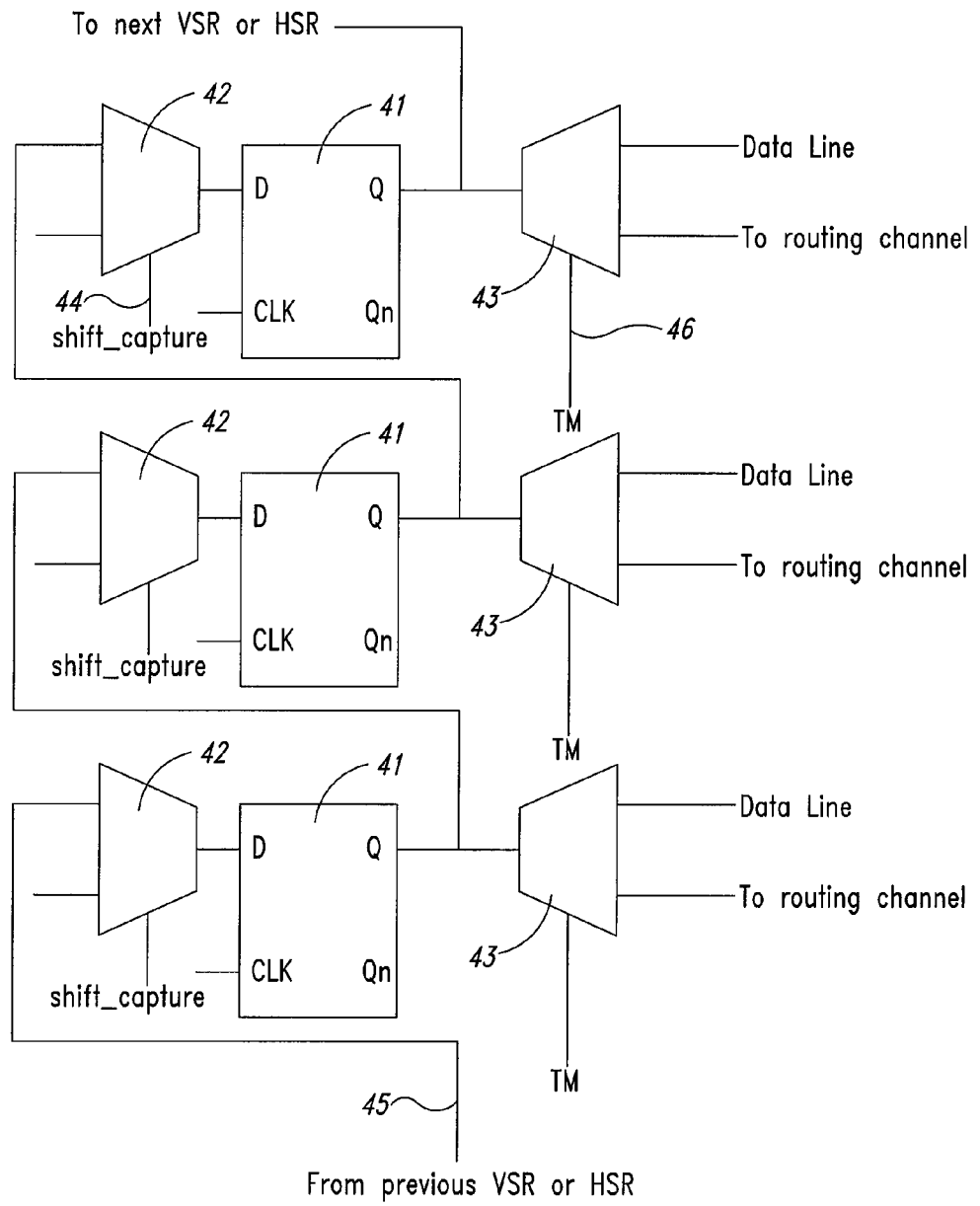
FIG. 4 shows details of vertical and horizontal shift registers having additional logic (demultiplexer) for testing mode, according to one embodiment of this invention.

FIG. 4 shows detailed circuit diagram of said registers having additional logic (demultiplexers 43) for enabling a testing mode according to various embodiments. The registers are provided with a flip-flop 41 and a multiplexer 42. The control line of the multiplexer 42 is the shift-capture signal 44. During configuration mode the multiplexer 42 remains in the shift mode and the shift-capture signal 44 is selected for shifting the data through the registers. In the test mode, if VSR/HSR is used for providing a test vector then multiplexer 42 is selected for shifting the data, else if VSR/HSR is used for capturing data, then multiplexer 42 selects the data from the routing tracks. At the output side of the registers demultiplexers 43 are provided for selecting an output of the flip-flop 41 in the test mode and selecting data lines in the configuration mode.

In the test mode the VSR/HSR can be used for two purposes: for applying the data to interconnect tracks and for capturing the response from routing tracks. If it is used for applying data, the first flip-flop of this register is connected to the pad of the FPGA (and if JTAG instruction is used then said first flip-flop of the register is connected to TDI) that supplies the stream of serial test vectors. It is shifted in the VSR/HSR. Once the complete data is shifted, it is applied to the routing tracks. Then the next test vectors can be applied to the VSR/HSR. If the VSR/HSR is used for capturing the response, then output of the routing tracks are connected to the input of the flip-flops. These responses are captured in parallel in the VSR/HSR and serially shifted out to one of the FPGA 4 pads or to the TDO in case JTAG is used for testing, which is then verified By using the above scheme, test vectors can be applied in parallel to all interconnect lines and the response can be captured in parallel on the other side of the interconnect lines without forming snake-like structures. This will reduce the testing time significantly and the maximum uses of the configuration blocks (VSR and HSR). The same scheme can also be used for the PLB testing by applying test vectors from VSR/HSR and capturing the response on the other side. Also boundary scan registers can be used in place of VSR/HSR or combination of both. Test vectors applied can be of any combination by feeding the vectors externally or from the JTAG.

All of the foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A field-programmable gate array (FPGA) device, comprising:
    a plurality of programmable logic blocks connected to each other through interconnect resources;
    a first set of registers connected to the interconnect resources for configuring the programmable logic blocks; and
    additional logic, coupled to the registers, for selecting an interconnect/logic block testing mode, thereby enabling rapid interconnect/logic testing.

2. The FPGA device as recited in claim 1, further comprising a second set of registers connected to the interconnect resources, wherein the first and second sets of registers are centrally positioned perpendicular to each other to form four quadrants of an array of the plurality of programmable logic blocks for enabling diagonal interconnect testing.

3. The FPGA device as recited in claim 1, wherein the additional logic comprises a plurality of demultiplexers connected respectively to output lines of the registers, and wherein each demultiplexer has a select terminal that receives a control signal for selecting either the interconnect/logic block testing mode or a configuration mode.

4. The FPGA device as recited in claim 1, further comprising a plurality of demultiplexers connected respectively to output lines of the registers, wherein each demultiplexer has a select terminal operable to receive a control signal for selecting either the interconnect/logic block testing mode or a configuration mode.

5. The FPGA device as recited in claim 1, wherein the additional logic comprises a plurality of demultiplexers connected respectively to output lines of the registers, and wherein each demultiplexer has a select terminal that receives a control signal for selecting whether data is sent from the registers to the programmable logic blocks or from the programmable logic blocks to the registers.

6. The FPGA device as recited in claim 1, wherein the registers comprise shift registers, wherein each shift register comprises a series of flip-flops and each flip-flop has an input connected to an output of another one of the flip-flops, and wherein the switching logic is configured to transmit data to/from the programmable logic blocks in parallel.

7. The FPGA device as recited in claim 1, wherein the registers enable diagonal interconnect/logic testing.

8. The FPGA device as recited in claim 1, further comprising a second set of registers connected to the interconnect resources and operable to receive data from a rapid interconnect/logic test.

9. The FPGA device as recited in claim 8, wherein the first and second sets of registers are centrally positioned perpendicular to each other to form four quadrants of an array of the plurality of programmable logic blocks for enabling diagonal interconnect testing.

10. A method for interconnect/logic block testing of a field-programmable gate array (FPGA), comprising:
  connecting a first set of registers to interconnect resources, wherein the registers configure programmable logic blocks, and wherein the programmable logic blocks are connected to each other through the interconnect resources; and
  selecting an interconnect/logic testing mode, using additional logic coupled to the registers, to enable rapid interconnect/logic testing and a reduction in IO pins.

11. The method as recited in claim 10, further comprising demultiplexing an output of each of the registers and selecting either the interconnect/logic testing mode or a configuration mode.

12. The method as recited in claim 10, further comprising positioning the registers in a center of the programmable logic blocks and perpendicular to each other to form four quadrants of an array of the programmable logic blocks for enabling diagonal interconnect/logic testing.

13. A field-programmable gate array (FPGA) device, comprising:
  an array of programmable logic blocks;
  a plurality of interconnect resources configured to selectively interconnect the programmable logic blocks to one another;
  a first set of registers connected to the interconnect resources, wherein the registers configure the programmable logic blocks; and switching logic configured to selectively output data from the registers to the programmable logic blocks and selectively input data from the programmable logic blocks to the registers.

14. The FPGA device as recited in claim 13, further comprising a second set of registers connected to the interconnect resources, wherein the first and second sets of registers are centrally positioned perpendicular to each other to form four quadrants of the array of programmable logic blocks.

15. The FPGA device as recited in claim 13, wherein the switching logic comprises a plurality of demultiplexers connected respectively to output lines of the registers, and wherein each demultiplexer has a select terminal that receives a control signal for selecting whether data is sent from the registers to the programmable logic blocks or from the programmable logic blocks to the registers.

16. The FPGA device as recited in claim 13, wherein the registers comprise shift registers, wherein each shift register comprises a series of flip-flops and each flip-flop has an input connected to an output of another one of the flip-flops, and wherein the switching logic is configured to transmit data to/from the programmable logic blocks in parallel.

17. The FPGA device as recited in claim 14, wherein the first and second sets of registers enable diagonal interconnect/logic testing.

18. The FPGA device as recited in claim 13, further comprising a second set of registers connected to the interconnect resources and operable to receive data from a rapid interconnect/logic test.

19. The FPGA device as recited in claim 18, wherein the first and second sets of registers are centrally positioned perpendicular to each other to form four quadrants of the array of programmable logic blocks for enabling diagonal interconnect testing.

20. A method, comprising:
  interconnecting an array of programmable logic blocks to one another using a plurality of interconnect resources;
  configuring the programmable logic blocks using a first set of registers connected to the interconnect resources; and
  using switching logic, outputting data from the registers to the programmable logic blocks and inputting data from the programmable logic blocks to the registers.

21. The method as recited in claim 20, further comprising positioning a second set of registers perpendicular to the first set of registers to form four quadrants of the array of programmable logic blocks.

22. The method as recited in claim 20, further comprising receiving a control signal for selecting whether data is sent from the registers to the programmable logic blocks or from the programmable logic blocks to the registers.

* * * * *

UNITED STATES PATENT AND TRADEMARK OFFICE
CERTIFICATE OF CORRECTION

PATENT NO.       : 7,477,070 B2                                    Page 1 of 1
APPLICATION NO.  : 11/294645
DATED            : January 13, 2009
INVENTOR(S)      : Singh et al.

It is certified that error appears in the above-identified patent and that said Letters Patent is hereby corrected as shown below:

On the Title page, in field (54), in "Title", in column 1, line 2, after "OF" insert -- A --.

In column 1, line 2, after "OF" insert -- A --.

In column 2, line 59, delete "iOBs" and insert -- IOBs --, therefor.

Signed and Sealed this

Sixteenth Day of June, 2009

JOHN DOLL
*Acting Director of the United States Patent and Trademark Office*